(12) United States Patent
Layadi et al.

(10) Patent No.: US 6,180,518 B1
(45) Date of Patent: Jan. 30, 2001

(54) METHOD FOR FORMING VIAS IN A LOW DIELECTRIC CONSTANT MATERIAL

(75) Inventors: Nace Layadi; Sailesh Mansinh Merchant; Simon John Molloy; Pradip Kumar Roy, all of Orlando, FL (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/430,226

(22) Filed: Oct. 29, 1999

(51) Int. Cl.$^7$ .................... H01L 21/4763; H01L 21/311; H01L 21/302; H01L 21/461
(52) U.S. Cl. .................. 438/639; 438/622; 438/637; 438/700; 438/738; 438/623
(58) Field of Search ........................... 438/634, 623, 438/624, 637, 638, 639, 640, 672, 622, 666, 700, 702, 725, 734, 736, 738, 743, 744, 735

(56) References Cited

U.S. PATENT DOCUMENTS

| | | | |
|---|---|---|---|
| 5,209,817 | * | 5/1993 | Ahmad et al. ................ 156/643 |
| 5,472,913 | * | 12/1995 | Havemann et al. ............ 437/195 |
| 5,510,294 | * | 4/1996 | Dixit et al. .................... 438/640 |
| 6,071,806 | * | 6/2000 | Wu et al. ...................... 438/622 |

* cited by examiner

Primary Examiner—Charles Bowers
Assistant Examiner—Thanhha Pham
(74) Attorney, Agent, or Firm—Allen, Dyer, Doppelt, Milbrath & Gilchrist, P.A.

(57) ABSTRACT

A method for making a semiconductor device includes the steps of forming a first conductive layer adjacent a substrate, forming an etch stop layer on the conductive layer, and forming a dielectric layer on the etch stop layer. The dielectric layer includes a material having a low dielectric constant, and a via is formed through the dielectric layer to expose the etch stop layer at the bottom, with porous sidewalls being produced. The exposed etch stop layer is etched using an etchant that cooperates with etched material from the etch stop layer to form a polymeric layer to coat the porous sidewalls of the via. Since the etchant cooperates with the etched material from the etch stop layer to form the polymeric layer coating the porous sidewalls of the via, a separate coating layer deposition step is not required after the via is etched and cleaned. After the porous sidewalls have been coated and polymeric material has been etched from the bottom of the via, a barrier metal layer is formed on the polymeric layer, a seed layer is formed on the barrier metal layer, and a second conductive layer is formed on the seed layer contacting the first conductive layer in the via.

32 Claims, 4 Drawing Sheets

METHOD FOR FORMING VIAS IN A LOW DIELECTRIC CONSTANT MATERIAL

FIELD OF THE INVENTION

The present invention relates to the field of semiconductor processing, and, more particularly, to a method for forming a via through a low dielectric constant material in a semiconductor device.

BACKGROUND OF THE INVENTION

Semiconductor devices continue to shrink in size and increase in complexity. As a result, a semiconductor device requires very close spacing of interconnect lines, and often requires a plurality of conductive layers for interconnecting the circuits formed therein. Dielectric layers separate the conductive layers and vias. Capacitance and cross talk between adjacent interconnect lines becomes more of a problem as the device geometries shrink and densities increase.

Typically, a dielectric layer includes silicon dioxide. Attempts have been made to replace silicon dioxide with a low dielectric constant material, i.e., with a material having a dielectric constant less than 4. The lower the dielectric constant, the better the insulator, thus lowering the capacitance between closely spaced interconnect lines. A dielectric material having a dielectric constant less than about 3.5 sufficiently reduces the capacitance between interconnect lines in typical sub-micron circuits.

Unfortunately, a low dielectric constant material may have low mechanical strength and poor dimensional stability. These characteristics require extra processing steps when forming a via through a low dielectric constant material. Porous sidewalls of the via may cause stability and adhesion problems during barrier and seed layer deposition. One approach to these problems is to perform a coating deposition step after via etch and clean, but prior to deposition of the barrier and seed layers.

The coating deposition forms a layer on the porous sidewalls of the via making them conformal. This layer fills in the porous openings in the sidewalls thus allowing the barrier and seed layers to be conformal when deposited. Unfortunately, deposition of the coating layer adds extra processing steps when making a semiconductor device. As discussed above, this added step is performed after the coating on the sidewalls of the via has been etched and cleaned. During the coating deposition step, the bottom of the via is also coated. Consequently, another processing step is required to etch and clean the bottom of the via.

SUMMARY OF THE INVENTION

In view of the foregoing background, it is therefore an object of the present invention to reduce the number of processing steps when making a semiconductor device having a via, such as formed through a low dielectric constant material.

This and other objects, advantages and features in accordance with the present invention are provided by a method for making a semiconductor device comprising the steps of forming a first conductive layer adjacent a substrate, forming an etch stop layer on the first conductive layer, and forming a dielectric layer on the etch stop layer. The dielectric layer preferably comprises a material having a low dielectric constant, and a via is formed through the dielectric layer to expose the etch stop layer at the bottom, with porous sidewalls of the via being produced. The method preferably further includes etching the exposed etch stop layer using an etchant, and while the etchant cooperates with etched material from the etch stop layer to form a polymeric layer to coat the porous sidewalls of the via.

The polymeric layer is advantageously formed in-situ with formation of the via, thus reducing the number of processing steps by at least one when making a semiconductor device having a via formed through a low dielectric constant material. Since the etchant cooperates with the etched material from the etch stop layer to form the polymeric layer coating the porous sidewalls of the via, a separate coating layer deposition step is not required after the via is etched and cleaned.

The method preferably further comprises the step of etching polymeric material from the bottom of the via, thus cleaning the via. The etchant preferably comprises at least one of monofluoromethane, difluoromethane and trifluoromethane. To control formation of the polymeric layer, the etchant preferably further includes predetermined amounts of argon and oxygen.

The dielectric layer preferably comprises a material having a dielectric constant less than about 4. The lower the dielectric constant, the lower the capacitance between closely spaced interconnect lines. The method preferably further includes the step of etching polymeric material from the bottom of the via.

After the sidewalls have been coated and polymeric material has been removed from the bottom of the via, the method further includes the steps of forming a barrier metal layer on the polymeric layer, and forming a seed layer on the barrier metal layer. A second conductive layer is formed on the seed layer contacting the first conductive layer.

Another aspect of the invention relates to a method for forming a polymeric layer on porous sidewalls of a via in a semiconductor device comprising an etch stop layer on a first conductive layer and a dielectric layer on the first conductive layer. The method preferably comprises the steps of forming the via through the dielectric layer to expose the etch stop layer at the bottom and producing porous sidewalls, and etching the exposed etch stop layer using an etchant that cooperates with etched material from the etch stop layer to form a polymeric layer to coat the porous sidewalls of the via.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
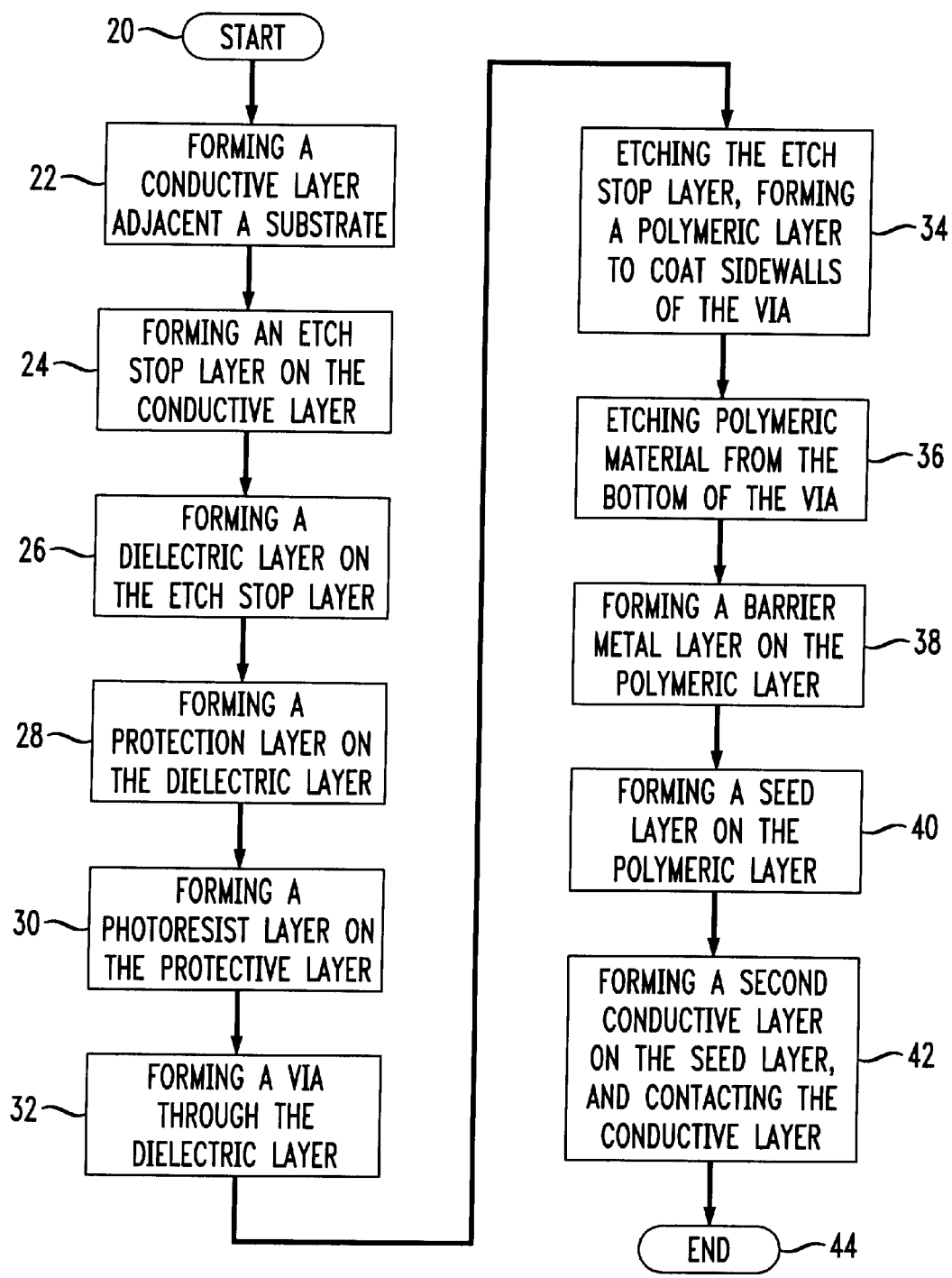
FIG. 1 is a flow chart illustrating the method for forming a polymeric layer on sidewalls of a via in accordance with the present invention.
Figure 2:
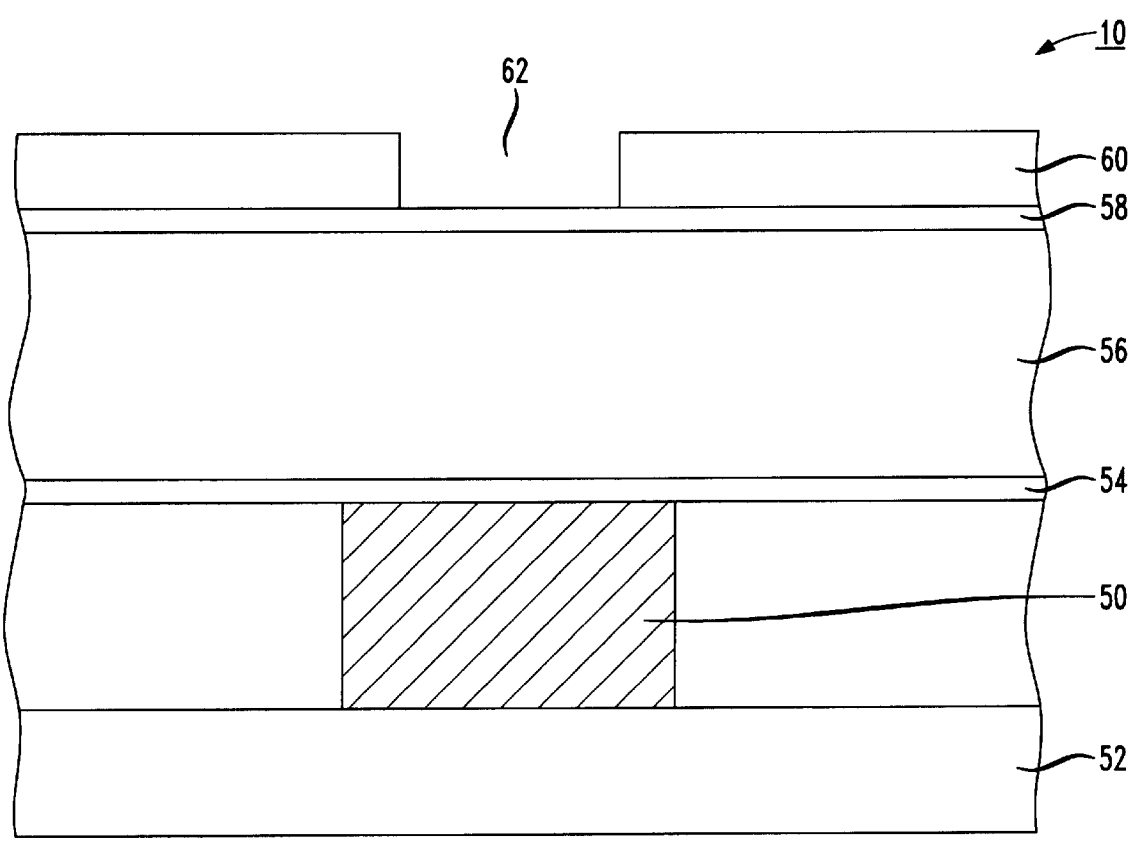
FIGS. 2–6 are cross-sectional views of a semiconductor device illustrating the process steps in accordance with the present invention.

A method for making a semiconductor device 10 in accordance with the present invention will be described with reference to FIGS. 1–6. From the start (Block 20), a conductive layer 50 is formed adjacent a substrate 52, as indicated at Block 22 and as shown in FIG. 2. The conductive layer 50 is normally deposited by a physical vapor deposition technique, as readily understood by one skilled in the art. The substrate 52 is a semiconductor substrate comprising silicon, or a silicon or polysilicon layer formed on the substrate. A plurality of devices, such as transistors (not shown), are formed in the substrate 52 using well known techniques. The conductive layer 50 preferably comprises copper since copper has a lower resistance than aluminum, which improves the RC time constant of the semiconductor device 10. However, in addition to copper, aluminum or alloys thereof can be used, as readily appreciated by one skilled in the art. The conductive layer 50 may be patterned and etched by techniques readily known by one skilled in the art, or may be formed using damascene or dual damascene techniques also readily known by one skilled in the art to form an interconnect level as shown in FIG. 2.

An etch stop layer 54 is formed on the conductive layer 50 using chemical vapor deposition, as indicated at Block 24 and as shown in FIG. 2. The etch stop layer 54 preferably comprises silicon nitride $Si_3N_4$, and prevents etching of the conductive layer 50 when a via 12 is formed (see FIG. 3) through the dielectric layer 56 on the etch stop layer, as will be explained in greater detail below. In addition, the etch stop layer 54 is a diffusion barrier preventing the conductive layer 50 from diffusing upward into the dielectric layer 56 may cause interlevel or intralevel shorts. In a worst case, the copper may eventually migrate to the active areas (i.e., source, gate and drain) of the transistors formed in the semiconductor device 10. The insulation characteristics of the dielectric layer 56 would change, and, consequently, the capacitance between closely spaced interconnect lines would be increased.

The dielectric layer 56 may be formed on the etch stop layer 54 using chemical vapor deposition or deposited using spin on methods, as indicated at Block 26 and as also shown in FIG. 2. The dielectric layer 56 preferably comprises a material having a low dielectric constant, i.e., less than 4. The lower the dielectric constant, the lower the capacitance between closely spaced interconnect lines. A dielectric material having a dielectric constant less than 3.5 sufficiently reduces the capacitance between interconnect lines in typical sub-micron circuits, as readily appreciated by one skilled in the art.

The dielectric layer 56 preferably comprises a polymeric material such as polysilsesquioxane, parylene, polyimide, benzocyclobutene and amorphous Teflon, which have low dielectric constants. Other preferred materials are Aerogel or Xerogel which are typically made from a geletion of tetraethyl orthosilicate stock solution. In one embodiment of the method according to the present invention, the dielectric layer 56 is applied by a spin-on method. In the spin-on method, the low dielectric constant material is dropped in a liquid form onto the etch stop layer 54 and the material disperses across the surface thereof.

A protection layer 58 is deposited on the dielectric layer 56 using chemical vapor deposition (Block 28), as further shown in FIG. 2. The protection layer 58 serves as a mask to insure that undesired portions of the dielectric layer 56 are not etched when the via 12 is formed. In addition, the protection layer 58 prevents nucleation and propagation of microcracks in the dielectric layer 56 since low dielectric constant materials have low mechanical strength and poor dimensional stability.

The protection layer 58 may be dense plasma silicon dioxide $SiO_2$, silicon nitride $Si_3N_4$ or other suitable dielectric. For silicate low dielectric materials, a chemical vapor deposited silicon dioxide protection layer is preferred because it uses the same CF based chemistry for etching as used for etching through the dielectric layer 56 when forming the via 12. The thickness of the protection layer 58 is preferably in a range of about 10 to 300 nm, and preferably about 50 nm.

A photoresist layer 60 (Block 30) is deposited on the protection layer 58, as shown in FIG. 2. The photoresist layer 60 is patterned by exposure to a UV light of a suitable wavelength. The patterned photoresist layer 60 defines an opening 62 corresponding to the via 12 to be formed through the dielectric layer 56.

Figure 3:
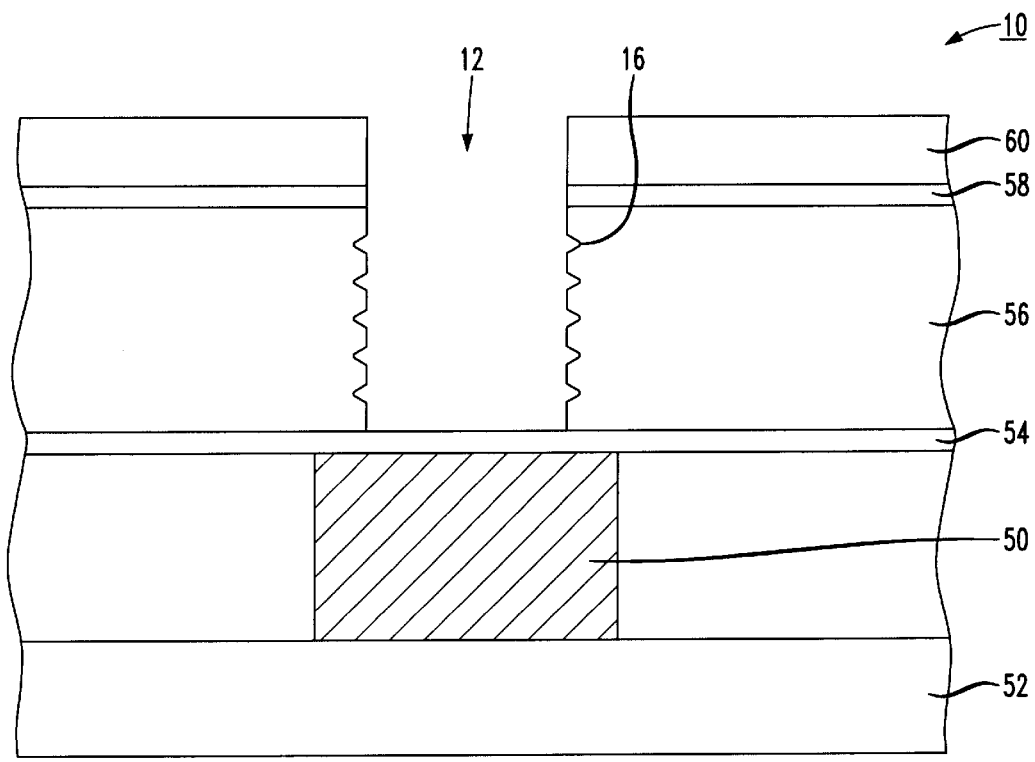

After the above described layers have been deposited, the method further includes the step of forming the via 12 through the protection layer 58 and the dielectric layer 56 to expose the etch stop layer 54 at the bottom of the via, as indicated at Block 32 and as shown in FIG. 3. Etching through the protection layer 56 may be performed using an etchant gas comprising fluorinated carbon gasses, e.g., $CF_4$, $C_4F_8$ or $C_2F_6$, as readily understood by one skilled in the art. These etchant gasses may also be mixed with $CHF_3$. The dielectric layer 56 may be etched using $N_2H_2$. Both of these etching steps may be performed using reactive ion etching.

As discussed above, a low dielectric constant material unfortunately typically has low mechanical strength and poor dimensional stability. Consequently, when the via 12 is formed through the low constant dielectric material, the sidewalls 16 of the via are porous. This may cause stability and adhesion problems during barrier and seed layer deposition.

Figure 4:
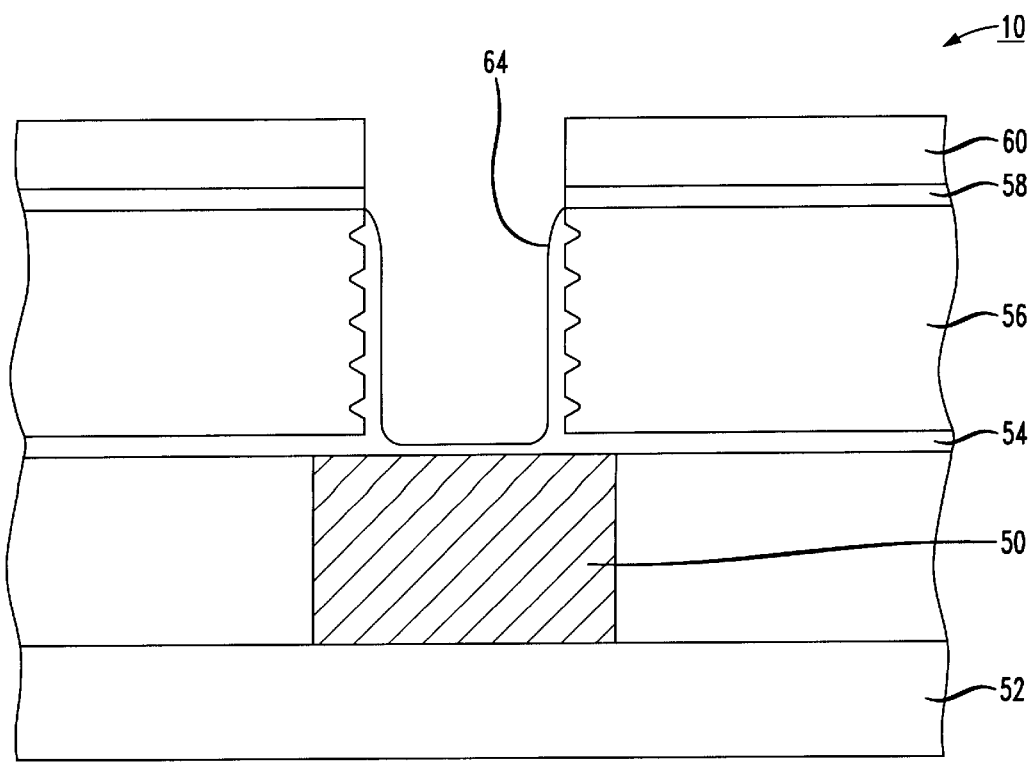

After the dielectric layer 56 has been etched to expose the upper surface of the etch stop layer 54, the exposed etch stop layer is etched (Block 34) while the etchant cooperates with etched material from the etch stop layer to form a polymeric layer 64 to coat the porous sidewalls 16 of the via 12, as shown in FIG. 4. The etchant etches away fragments of the etch stop layer 54 such that they react with the gas components contained in the etchant to form the polymeric layer 64 on the sidewalls 16 of the via 12.

The polymeric layer 64 fills in the porous openings in the sidewalls 16 of the via 12, thus making the sidewalls conformal. This layer 64 allows the barrier and seed layers to be conformal when deposited. The polymeric layer 64 is advantageously formed in-situ with formation of the via 12, thus reducing the number of processing steps by at least one when making a semiconductor device 10 having a via formed through a low dielectric constant material. Since the etchant cooperates with the etched material from the etch stop layer 54 to form the polymeric layer 64 coating the porous sidewalls 16 of the via 12, a separate coating layer deposition step is not required after the via is etched and cleaned.

The etchant comprises at least one of difluoromethane $CH_2F_2$, monofluoromethane $CH_3F$ and trifluoromethane $CHF_3$. To control the amount of polymer formation and maintain critical dimensions, predetermined amounts of argon and oxygen may be added to the etchant. The polymer layer 64 may preferably have a thickness in a range of about 10 to 100 nm. The etchant may also be mixed with the fluorinated carbon gasses as listed above.

The difluoromethane $CH_2F_2$, monofluoromethane $CH_3F$ and trifluoromethane $CHF_3$ etchants preferably have a flow rate in a range of about 25–75 sccm. The flow rate of the argon and the oxygen depend upon the size of the via 12, and the desired thickness of the polymeric layer 64, as will be readily appreciated by one skilled in the art. The argon may typically have a flow rate in a range of about 75–125 sccm, and oxygen may have a flow rate less than about 25 sccm. The pressure of the reactive ion etch chamber may be in a range of about 30–70 mTorr, with a power level in a range of about 500–700 watts.

Figure 5:
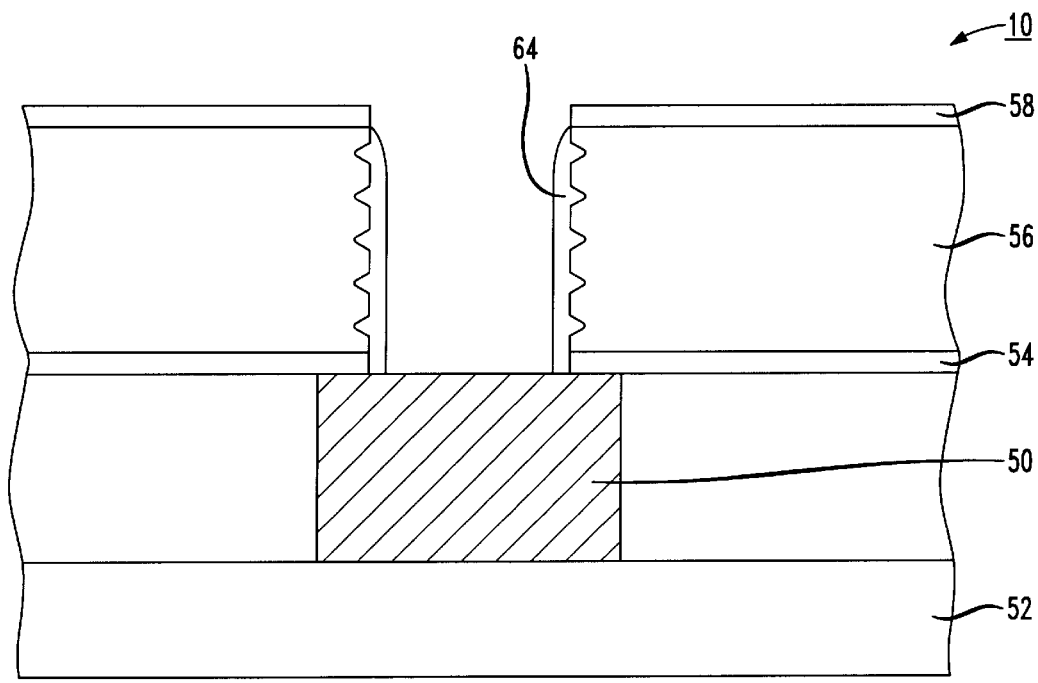

Since some of the polymeric material is redeposited on the bottom of the via 12, the method further includes etching the polymeric material from the bottom of the via, as indicated at Block 36. Referring now to FIG. 5, the bottom of the via 12 is clean and the copper conductive layer 50 is exposed using reactive ion etching. The etching is performed anisotropically so that the polymeric layer 64 on the sidewalls 16 of the via 12 is not removed.

In addition to removing the polymeric material from the bottom of the via 12, the photoresist layer 60 on the protection layer 58 is also removed. A plasma resist strip reactor may be used, as will be readily understood by one skilled in the art. During this post etch photoresist layer 60 removal and cleaning process, hydrogen containing gas (e.g., water, forming gas) and a fluorinated gas, such as $NF_3$ or $CF_4$, and a low percentage of oxygen can be used to remove the photoresist layer 60. Consequently, the metal surface at the bottom of the via 12 is cleaned while not removing the polymeric layer 64 from the sidewalls 16 of the via 12.

This etching and cleaning step is preferably performed using low pressure and high power for increased ion directivity. A dual source (microwave and RIE) apparatus or an inductively coupled plasma photoresist strip tool can be used, as will be readily understood by one skilled in the art. Hydrogen strips photoresist and reduces the metal oxidation. Having a low amount of $0_2$ enhances photoresist stripping while avoiding oxidation of the metal, and the presence of the F radicals enhances photoresist removal rate and cleaning of the exposed metal surface at the bottom of the via 12. Keeping the exposed metal surface clean and avoiding formation of an oxidized layer allows lower via contact resistance. The use of a solvent as in a conventional via clean may not be suitable, since it would laterally attack the sidewalls 16 of the via 12. This could cause problems when the barrier metal layer and seed layer are deposited.

Figure 6:
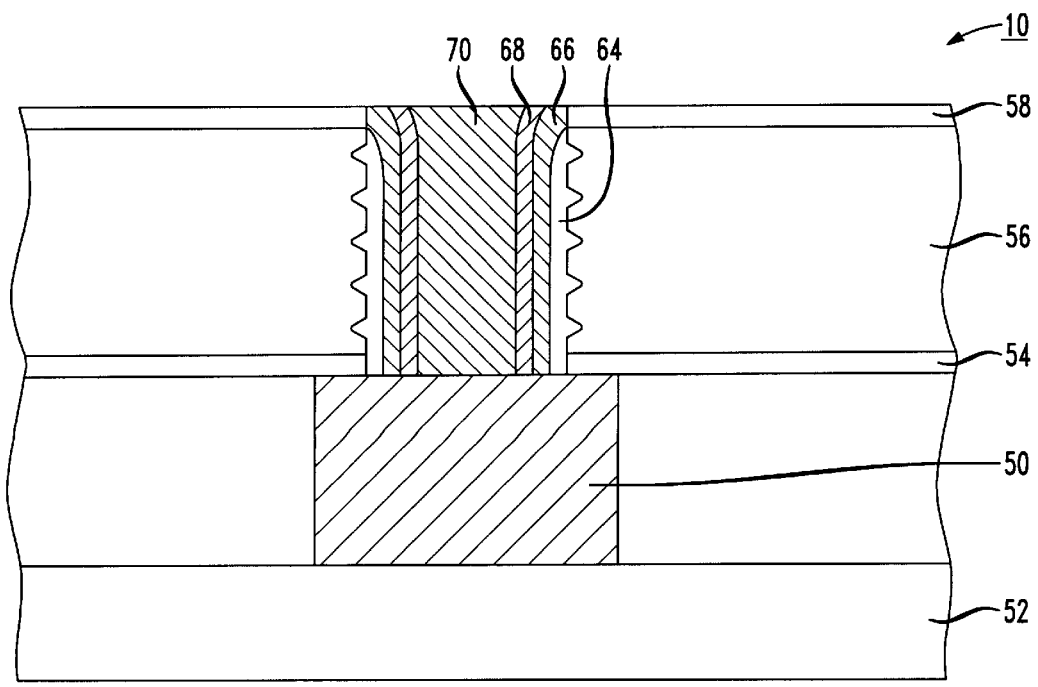

The method further preferably includes forming a barrier metal layer 66 on the sidewalls 16 of the via 12, forming a seed layer 68 on the barrier metal layer, and forming a second conductive layer 70 as indicated at Blocks 38, 40, 42 and in FIG. 6. The second conductive layer 70 may be a metal plug formed by techniques well known by one skilled in the art. The method is thus completed at Block 44. Since the conductive layer 50 is preferably copper, the barrier metal layer 66 preferably comprises a layer of tantalum, or a layer of tantalum nitride on the tantalum layer. A seed layer 68 preferably comprises a layer of copper. If the conductive layer 50 is aluminum or alloys thereof, then the barrier metal layer 66 is preferably a layer of titanium and a layer of titanium nitride on the titanium layer. A wetting layer of titanium may be required for aluminum and alloys thereof. Other metals and alloys thereof forming the barrier metal layer 66 are also contemplated by the present invention. The second conductive layer 70 in the via 12 is preferably also copper. However, other metals are acceptable.

Another aspect of the invention relates to a method for forming a polymeric layer 64 on porous sidewalls 16 of a via 12 in a semiconductor device 10 comprising an etch stop layer 54 on a conductive layer 50 and a dielectric layer 56 on the first conductive layer. The method preferably comprises the steps of forming the via 12 through the dielectric layer 56 to expose the etch stop layer 54 at the bottom and producing porous sidewalls 16, and etching the exposed etch stop layer using an etchant, and while the etchant cooperates with etched material from the etch stop layer to form a polymeric layer 64 to coat the porous sidewalls of the via.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a semiconductor device comprising the steps of:
   forming a first conductive layer adjacent a substrate;
   forming an etch stop layer on the first conductive layer;
   forming a dielectric layer on the etch stop layer;
   forming a via through the dielectric layer to expose the etch stop layer at the bottom and producing porous sidewalls; and
   etching the exposed etch stop layer using an etchant, and while the etchant cooperates with etched material from the etch stop layer to form a polymeric layer to coat the porous sidewalls of the via.

2. A method according to claim 1, further comprising the step of etching polymeric material from the bottom of the via.

3. A method according to claim 2, wherein the etching is performed anisotropically.

4. A method according to claim 1, wherein the polymeric layer has a thickness less than about b 100nm.

5. A method according to claim 1, wherein the etchant comprises at least one of monofluoromethane, difluoromethane and trifluoromethane.

6. A method according to claim 5, wherein the etchant further comprises argon and oxygen for controlling formation of the polymeric layer.

7. A method according to claim 1, wherein the dielectric layer comprises a material having a dielectric constant less than about 4.

8. A method according to claim 1, wherein the etch stop layer comprises silicon nitride.

9. A method according to claim 1, wherein the first conductive layer comprises copper.

10. A method according to claim 1, further comprising the steps of:
    forming a barrier metal layer on the polymeric layer;
    forming a seed layer on the barrier metal layer; and
    forming a second conductive layer on the seed layer and contacting the first conductive layer.

11. A method according to claim 1, wherein the etching is performed using reactive ion etching.

12. A method for making a semiconductor device comprising the steps of:
    forming a first conductive layer adjacent a substrate;
    forming an etch stop layer on the first conductive layer;
    forming a dielectric layer on the etch stop layer, the dielectric layer comprising a material having a dielectric constant less than about 4;
    forming a via through the dielectric layer to expose the etch stop layer at the bottom and producing porous sidewalls;

etching the exposed etch stop layer using an etchant, and while the etchant cooperates with etched material from the etch stop layer to form a polymeric layer to coat the porous sidewalls of the via; and etching polymeric material from the bottom of the via.

13. A method according to claim 12, wherein the step of etching polymeric material from the bottom of the via is performed anisotropically.

14. A method according to claim 12, wherein the polymeric layer has a thickness less than about 100 nm.

15. A method according to claim 12, wherein the etchant comprises at least one of monofluoromethane, difluoromethane and trifluoromethane.

16. A method according to claim 15, wherein the etchant further comprises argon and oxygen for controlling formation of the polymeric layer.

17. A method according to claim 12, wherein the etch stop layer comprises silicon nitride.

18. A method according to claim 12, wherein the first conductive layer comprises copper.

19. A method according to claim 12, further comprising the steps of:

forming a barrier metal layer on the polymeric layer;

forming a seed layer on the barrier metal layer; and forming a second conductive layer on the seed layer and contacting the first conductive layer.

20. A method according to claim 19, wherein the second conductive layer comprises a metal plug.

21. A method according to claim 19, wherein the second conductive layer comprises at least one of copper, aluminum and alloys thereof.

22. A method according to claim 12, wherein the etchings are performed using reactive ion etching.

23. A method for forming a polymeric layer on porous sidewalls of a via in a semiconductor device comprising an etch stop layer on a first conductive layer and a dielectric layer on the first conductive layer, the method comprising the steps of:

forming the via through the dielectric layer to expose the etch stop layer at the bottom and producing porous sidewalls; and etching the exposed etch stop layer using an etchant, and while the etchant cooperates with etched material from the etch stop layer to form a polymeric layer to coat the porous sidewalls of the via.

24. A method according to claim 23, further comprising the step of etching polymeric material from the bottom of the via.

25. A method according to claim 23, wherein the etching is performed anisotropically.

26. A method according to claim 23, wherein the polymeric layer has a thickness less than about 100 nm.

27. A method according to claim 23, wherein the etchant comprises at least one of monofluoromethane, difluoromethane and trifluoromethane.

28. A method according to claim 27, wherein the etchant further comprises argon and oxygen for controlling formation of the polymeric layer.

29. A method according to claim 23, wherein the dielectric layer comprises a material having a dielectric constant less than about 4.

30. A method according to claim 23, wherein the etch stop layer comprises silicon nitride.

31. A method according to claim 23, wherein the first conductive layer comprises copper.

32. A method according to claim 23, wherein the etching is performed using reactive ion etching.

* * * * *